US008558264B2

(12) United States Patent
Mochizuki

(10) Patent No.: US 8,558,264 B2
(45) Date of Patent: Oct. 15, 2013

(54) LIGHT-EMITTING DEVICE AND PROJECTOR

(75) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 149 days.

(21) Appl. No.: 13/169,294

(22) Filed: Jun. 27, 2011

(65) Prior Publication Data

US 2012/0001210 A1 Jan. 5, 2012

(30) Foreign Application Priority Data

Jun. 30, 2010 (JP) .................. 2010-148752

(51) Int. Cl.
*H01L 33/00* (2010.01)
(52) U.S. Cl.
USPC .............. 257/98; 257/E33.028; 257/E33.033; 257/E33.025; 257/E33.034
(58) Field of Classification Search
None
See application file for complete search history.

(56) References Cited

U.S. PATENT DOCUMENTS

2008/0285609 A1 11/2008 Ohta et al.
2012/0001210 A1 1/2012 Mochizuki

FOREIGN PATENT DOCUMENTS

JP 2008-169060 7/2008
JP 2009-170658 7/2009

*Primary Examiner* — Julio J Maldonado
*Assistant Examiner* — Mohammad Choudhry
(74) *Attorney, Agent, or Firm* — Harness, Dickey & Pierce, P.L.C.

(57) ABSTRACT

A light-emitting device includes a first layer, a second layer, and a semiconductor body interposed between the first and second layers, wherein the semiconductor body has a first fine-wall-shape member, a second fine-wall-shape member, and a semiconductor member interposed between the first and second fine-wall-shape members, the first and second fine-wall-shape members have a third layer, a fourth layer, and a fifth layer interposed between the third and fourth layers, the fifth layer is a layer that generates light and guides the light, the third and fourth layers are layers that guide the light generated in the fifth layer, the first and second layers are layers that suppress leakage of the light generated in the fifth layer, and the propagating direction of the light generated in the fifth layer intersects with the first and second fine-wall-shape members.

9 Claims, 4 Drawing Sheets

US 8,558,264 B2

LIGHT-EMITTING DEVICE AND PROJECTOR

This application claims priority to Japanese Patent Application No. 2010-148752 filed Jun. 30, 2010 which is hereby expressly incorporated by reference herein in its entirety.

BACKGROUND

1. Technical Field

The present invention relates to a light-emitting device and a projector.

2. Related Art

One known light-emitting device is obtained by forming a light-emitting layer made of a group-III nitride semiconductor on a substrate, injecting a current from an external portion, and combining electrons and holes inside the light-emitting layer so as to emit light. In such a light-emitting device, a strain may be generated between the light-emitting layer and the substrate. Particularly, when InGaN is used in the light-emitting layer, and materials other than InGaN (for example, GaN) are used in the substrate, a lattice mismatch therebetween is generated and the strain increases. When such a strain is generated, an electric field due to a piezoelectric field (piezoelectric field) is applied to the light-emitting layer, and a radiative recombination probability between the electrons and the holes is remarkably reduced.

To address the above problem, for example, there has been proposed a method for relaxation of a strain generated between the light-emitting layer and the substrate by forming the group-III nitride semiconductor using a fine columnar crystal structure as disclosed in JP-A-2008-169060.

However, according to the technique disclosed in JP-A-2008-169060, a side surface having a fine columnar crystal structure is exposed. Therefore, non-radiative recombination caused by an impurity or a defect near the side surface occurs, and the light-emitting efficiency may be degraded.

SUMMARY

An advantage of some aspects of the invention is to provide a light-emitting device having high light-emitting efficiency. Another advantage of some aspects of the invention is to provide a projector having the light-emitting device described above.

According to one aspect of the invention, there is provided a light-emitting device including: a first layer having a first surface; a second layer having a second surface that faces the first surface; and a semiconductor body interposed between the first surface and the second surface, wherein the semiconductor body has a first fine-wall-shape member, a second fine-wall-shape member, and a semiconductor member, the first fine-wall-shape member and the second fine-wall-shape member having a third layer adjacent to the first surface; a fourth layer adjacent to the second surface; and a fifth layer interposed between the third layer and the fourth layer, the semiconductor member is interposed between the first fine-wall-shape member and the second fine-wall-shape member, the first layer and the second layer are made of GaN, the third layer, the fourth layer, the fifth layer, and the semiconductor member are made of $In_xGa_{1-x}N$ ($0<x<1$), a value x of the fifth layer is larger than the values x of the third layer, the fourth layer, and the semiconductor member, the fifth layer is a layer that generates and guides light, the third layer and the fourth layer are layers that guide the light generated in the fifth layer, the first layer and the second layer are layers that suppress leakage of the light generated in the fifth layer, a waveguide through which the light generated in the fifth layer propagates intersects with the first fine-wall-shape member and the second fine-wall-shape member as seen in a plan view from a direction normal to the first surface, lengths of the first fine-wall-shape member and the second fine-wall-shape member in an extending direction of the waveguide are set to $\lambda/2n_1$, and a length of the semiconductor member in an extending direction of the waveguide is set to $\lambda/2n_2$.

Here, $\lambda$ denotes a wavelength of the light generated in the fifth layer, $n_1$ denotes an effective refractive index of the first fine-wall-shape member and the second fine-wall-shape member, and $n_2$ denotes an effective refractive index of the semiconductor member.

In such a light-emitting device, the semiconductor member is formed between the first and second fine-wall-shape members. For this reason, it is possible to suppress a non-radiative recombination in the side surface of the first and second fine-wall-shape members. Therefore, in this light-emitting device, it is possible to obtain high light-emitting efficiency while strain generated between the substrate and the semiconductor body is relaxed. On the other hand, when such a semiconductor member is not provided, and the side surface of the fine-wall-shape member is exposed, non-radiative recombination due to an impurity or a defect in the vicinity of the side surface may occur, and the light-emitting efficiency may be degraded.

Furthermore, in such a light-emitting device, the semiconductor member is made of InGaN, and the first and second fine-wall-shape members are made of, for example, InGaN. For this reason, in comparison with a case where an insulation member made of, for example, silicon oxide or polyimide is formed between the first and second fine-wall-shape members, it is possible to make a thermal expansion coefficient of the first and second fine-wall-shape members and the semiconductor member close to each other. Therefore, in this light-emitting device, for example, even when heat is generated by current injection, it is possible to reduce stress applied to the semiconductor body due to thermal expansion, and suppress degradation of the light-emitting efficiency caused by the stress and a reduction of useful life.

In addition, in such a light-emitting device, the length of the first fine-wall-shape member in the extending direction of the waveguide is set to $\lambda/2n_1$, the length of the second fine-wall-shape member in the extending direction of the waveguide is set to $\lambda/2n_1$ and the length of the semiconductor member in the extending direction of the waveguide is set to $\lambda/2n_2$. As a result, out of the light propagating in the extending direction of the waveguide, light reflected at the interface when the light incidents from the fine-wall-shape member to the semiconductor member is cancelled by light reflected at the interface when the light incidents from the semiconductor member to the fine-wall-shape member. For example, in a case where the refractive index of the semiconductor member is larger than that of the fine-wall-shape member, the phase of light reflected at the interface when the light incidents from the fine-wall-shape member to the semiconductor member is inverted by 180° (out of phase by a half wavelength). At this moment, when the light is incident from the semiconductor member to the fine-wall-shape member, the phase of light reflected at the interface does not change. In a case where the lengths of the fine-wall-shape member and the semiconductor member in the extending direction of the waveguide are set to $\lambda/2n_1$ and $\lambda/2n_2$, respectively, a distance between the two interfaces becomes $\lambda/n_2$ in a single round trip. Therefore, if only the phase of the light reflected at one of the interfaces is inverted by 180° (out of phase by a half wavelength), the phases of the two reflected light become opposite to each other, so that they cancel each other. Similarly, in a case where a relationship of the refractive index is reversed, only the phase of the other reflected light is inverted, so that the two reflected light have opposite phases, and they cancel each other. In addition, in a case where the first and second fine-wall-shape members have the same refractive index; the reflectance when light incidents from the first fine-wall-shape member to the semiconductor member is the same as the reflectance when the light beam is incident from the semiconductor member to the fine-wall-shape member. Therefore, since the two reflected light perfectly cancel each other, there is no reflection when light propagates in the extending direction of the waveguide. That is, it is possible to avoid multiple reflections between the interface of the first fine-wall-shape member and the semiconductor member and the interface of the second fine-wall-shape member and the semiconductor member. As a result, it is possible to suppress laser oscillation caused by local reflection or feedback of light between interfaces inside the device.

According to another aspect of the invention, there is provided a light-emitting device including: a first layer having a first surface; a second layer having a second surface that faces the first surface; and a semiconductor body interposed between the first and second surfaces, wherein the semiconductor body has a first fine-wall-shape member, a second fine-wall-shape member, and a semiconductor member, the first and second fine-wall-shape members having a third layer adjacent to the first surface, a fourth layer adjacent to the second surface, and a fifth layer interposed between the third and fourth layers, the semiconductor member is interposed between the first and second fine-wall-shape members, the first and second layers are made of AlGaN, the third and fourth layers are made of GaN, the fifth layer and the semiconductor member are made of $In_xGa_{1-x}N$ ($0<x<1$), a value x of the fifth layer is larger than a value x of the semiconductor member, the fifth layer is a layer that generates and guides light, the third and fourth layers are layers that guide the light generated in the fifth layer, the first and second layers are layers that suppress leakage of the light generated in the fifth layer, a waveguide through which the light generated in the fifth layer propagates intersects with the first and second fine-wall-shape members as seen in a plan view from a direction normal to the first surface, lengths of the first and second fine-wall-shape members in an extending direction of the waveguide are set to $\lambda/2n_1$, and a length of the semiconductor member in an extending direction of the waveguide is set to $\lambda/2n_2$.

Here, $\lambda$ denotes a wavelength of the light generated in the fifth layer, $n_1$ denotes an effective refractive index of the first and second fine-wall-shape members, and $n_2$ denotes an effective refractive index of the semiconductor member.

In such a light-emitting device, similarly, it is possible to obtain high light-emitting efficiency.

The light-emitting device according to this aspect of the invention may be configured such that the semiconductor member may be formed on the opposite side of the first fine-wall-shape member relative to the second fine-wall-shape member and on the opposite side of the second fine-wall-shape member relative to the first fine-wall-shape member.

In such a light-emitting device, it is possible to suppress a non-radiative recombination on the side surfaces of the first and second fine-wall-shape members and to obtain higher light-emitting efficiency.

The light-emitting device may be a super-luminescent diode.

In such a light-emitting device, it is possible to suppress laser oscillation and reduce speckle noise when it is used in an image projection apparatus such as a projector or a light source of an image display apparatus.

The light-emitting device according to this aspect of the invention may further include a sixth layer formed to cover an output surface of the semiconductor body, and the sixth layer may be a layer that suppresses the reflection of the light generated in the fifth layer.

According to such a light-emitting device, it is possible to reduce the reflectance on the output surface.

The light-emitting device according to this aspect of the invention may be configured such that a value x of the fifth layer may be equal to or larger than 0.4 and equal to or smaller than 0.6.

According to such a light-emitting device, it is possible to output green light.

The light-emitting device according to this aspect of the invention may be configured such that the third layer may be doped with a first conductivity type, the fourth layer may be doped with a second conductivity type, and the semiconductor member may be undoped.

According to such a light-emitting device, the injection carriers (electrons and holes) can flow into the fine-wall-shape member avoiding the semiconductor member.

The light-emitting device may further include a first electrode electrically connected to the first layer; a second electrode electrically connected to the second layer, and a seventh layer formed between the second layer and the second electrode, wherein the seventh layer makes ohmic contact with the second electrode, the semiconductor body has a third surface connected to the first and second surfaces and a fourth surface that is connected to the first and second surfaces and faces the third surface, a contact surface between the seventh layer and the second electrode is arranged to extend from the third surface to the fourth surface, the contact surface is arranged to intersect with the first and second fine-wall-shape members as seen in a plan view from a direction normal to the first surface, lengths of the first and second fine-wall-shape members in an extending direction of the contact surface are set to $\lambda/2n_1$, and a length of the semiconductor member in an extending direction of the contact surface is set to $\lambda/2n_2$.

According to such a light-emitting device, it is possible to reduce a contact resistance of the second electrode using the seventh layer.

According to still another aspect of the invention, there is provided a projector including: the light-emitting device according to one of the above aspects of the invention; an optical modulator that modulates the light output from the light-emitting device based on image information; and a projection device that projects an image formed by the optical modulator.

According to such a projector, it is possible to obtain high power conversion efficiency.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described with reference to the accompanying drawings.

1. Light-emitting Device

Figure 1:
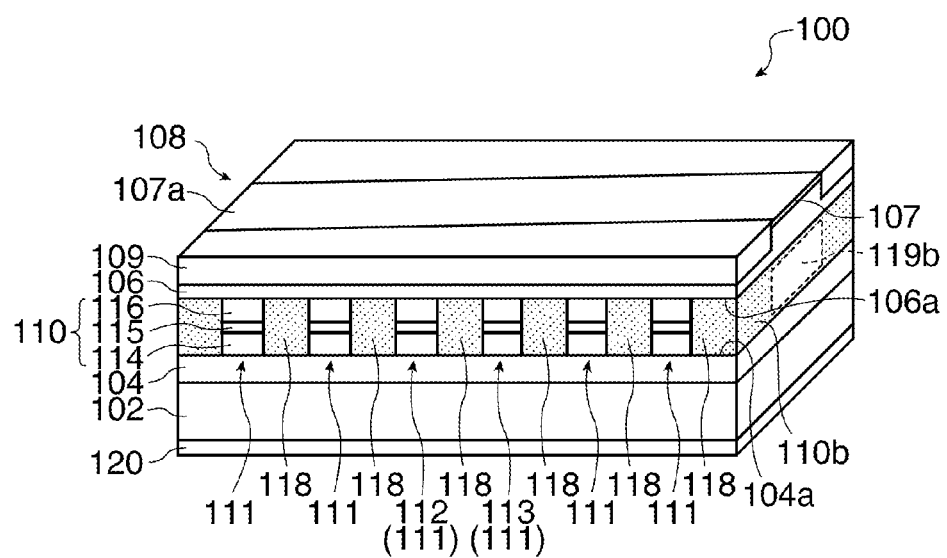
FIG. 1 is a perspective view schematically illustrating a light-emitting device.
Figure 2:
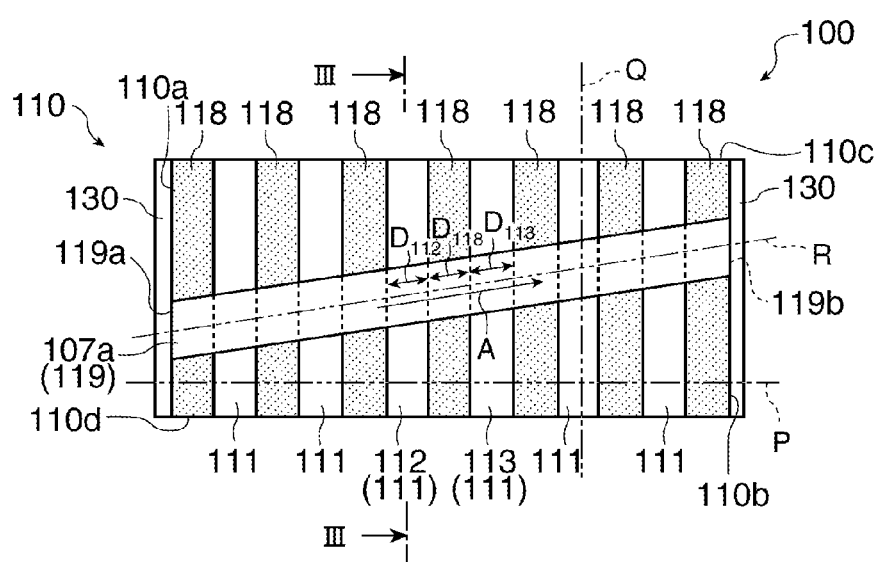
FIG. 2 is a plan view schematically illustrating the light-emitting device.
Figure 3:
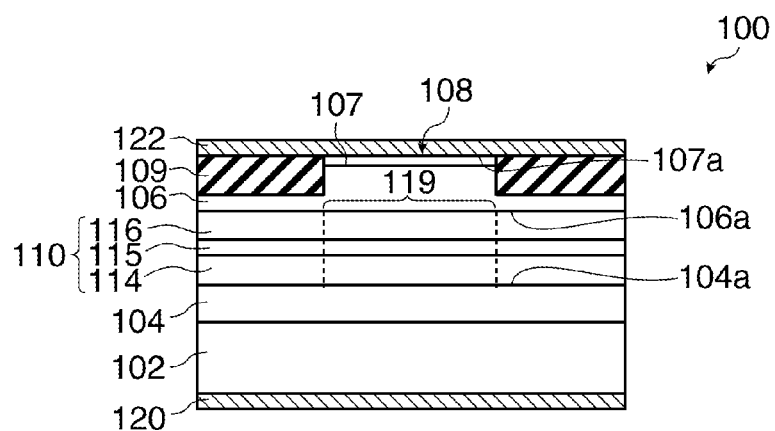
FIG. 3 is a cross-sectional view schematically illustrating the light-emitting device.

First, a light-emitting device according to an embodiment of the invention will be described with reference to the accompanying drawings. FIG. 1 is a perspective view schematically illustrating a light-emitting device 100 according to an embodiment of the invention. FIG. 2 is a plan view schematically illustrating the light-emitting device 100 according to the embodiment of the invention. FIG. 3 is a cross-sectional view taken along the line of FIG. 2 for schematically illustrating the light-emitting device 100 according to the embodiment of the invention. In addition, in FIG. 1, a second electrode 122 and a sixth layer 130 are omitted for the purposes of convenience. In addition, in FIG. 2, a second layer 106, an insulating portion 109, and a second electrode 122 are transparently illustrated for the purposes of convenience.

By way of example, a case where a super luminescent diode (hereinafter, referred to as an SLD) is used as a light-emitting device 100 will now be described. The SLD can suppress laser oscillation by suppressing formation of a resonator unlike a semiconductor laser. For this reason, it is possible to reduce speckle noise when the SLD is used in an image projection apparatus such as a projector or a light source of an image display apparatus.

As shown in FIGS. 1 to 3, the light-emitting device 100 includes a first layer 104 (hereinafter, also referred to as a "first cladding layer 104"), a second layer 106 (hereinafter, also referred to as a "second cladding layer 106"), and a semiconductor body 110. Further, the light-emitting device 100 may include a substrate 102, a sixth layer 130 (hereinafter, also referred to as an "anti-reflection layer 130"), a seventh layer 107 (hereinafter, also referred to as a "contact layer" 107), an insulation member 109, a first electrode 120, and a second electrode 122.

As the substrate 102, for example, a first conductivity type (for example, n-type) GaN substrate or a GaN template substrate obtained by forming an n-type GaN layer on a sapphire substrate may be used.

The first cladding layer 104 is formed on the substrate 102. As the first cladding layer 104, for example, an n-type GaN layer may be used. In addition, although not shown in the drawings, a buffer layer may be formed between the substrate 102 and the first cladding layer 104. As the buffer layer, for example, an n-type GaN layer may be used. The buffer layer may improve crystal quality of an overlying layer.

The semiconductor body 110 is formed on the first cladding layer 104. The second cladding layer 106 is formed on the semiconductor body 110. For this reason, the semiconductor body 110 is interposed between a first surface 104a (hereinafter, referred to as an upper surface 104a) of the first cladding layer 104 and a second surface 106a (hereinafter, referred to as a lower surface 106a) of the second cladding layer 106 facing the upper surface 104a.

The semiconductor body 110 has a rectangular shape (including a cube). As shown in FIG. 2, the semiconductor body 110 may include a third surface (hereinafter, also referred to as a first side surface 110a) and a fourth surface (hereinafter, also referred to as a second side surface 110b) opposite to each other, and third and fourth side surfaces 110c and 110d that connect the first and second side surfaces 110a and 110b, respectively, and are opposite to each other. As shown in FIG. 1, the first side surface 110a is a surface connecting the upper and lower surfaces 104a and 106a. Similarly, the side surfaces 110b, 110c, and 110d of the semiconductor body 110 are a surface connecting the upper surface 104a of the first cladding layer 104 and the lower surface 106a of the second cladding layer 106.

In addition, the normal line P of the first side surface 110a of the semiconductor body 110 intersects (for example, orthogonally) with the normal line (not shown) of the upper surface 104a of the first cladding layer 104. Similarly, each normal line (not shown) of the side surfaces 110b, 110c, and 110d of the semiconductor body 110 intersects (for example, orthogonally) with the normal line of the upper surface 104a of the first cladding layer 104.

The semiconductor body 110 includes a fine-wall-shape member 111 and a semiconductor member 118. The fine wall shape member 111 is formed on the first cladding layer 104. A plurality of fine-wall-shape members 111 may be formed, and the number of fine-wall-shape members 111 is not particularly limited. In the example of FIG. 1, the fine-wall-shape member 111 has a straight erected wall-like shape (plate shape) with respect to the upper surface 104a of the first cladding layer 104.

As shown in FIG. 2, the fine-wall-shape member 111 is arranged to extend from the third side surface 110c to the fourth side surface 110d as the light-emitting device 100 is seen from the direction normal to the upper surface 104a (as seen in a plan view). In the example of FIG. 2, the fine-wall-shape member 111 has a rectangular plane shape, and is provided parallel to the normal line Q of the third side surface 110c to extend from the third side surface 110c to the fourth side surface 110d. Although not shown in the drawings, the fine-wall-shape member 111 may have a parallelogram plane shape, and may be inclined against the normal line Q and extend from the third side surface 110c to the fourth side surface 110d. In the example of FIG. 2, a plurality of the fine-wall-shape members 111 has the same planar shape.

The length of the longer side (for example, the length of the side in a direction of the normal line Q) or the height (for example, the length in the direction orthogonal to the normal lines P and Q) of the fine-wall-shape member 111 is not particularly limited as long as the length of the shoter side of the fine-wall-shape member 111 (for example, the length of the side in a direction of the normal line P) is equal to or smaller than several hundreds of nanometers. However, as the lengths of the shorter and longer sides are reduced, the effect of the relaxation of a strain applied to the semiconductor body 110 becomes significant. Particularly, the length of the shorter side is preferably set to be equal to or smaller than 250 nm. In this manner, since the length of the lateral side of the fine-wall-shape member 111 is on a nanometer scale, the fine-wall-shape members 111 may be referred to as a "nano-wall 111." When the fine-wall-shape member 111 has a hexagonal crystal system, the longer direction of the fine-wall-shape member 111 may be an a-axis direction of the hexagonal crystal system.

As shown in FIGS. 1 and 3, the fine-wall-shape member 111 includes a third layer 114 (hereinafter, referred to as a "first guiding layer 114"), a fourth layer 116 (hereinafter, referred to as a "second guiding layer 116"), and an active layer 115 having a fifth layer (hereinafter, referred to as a "quantum well layer").

The first guiding layer 114 is formed on the first cladding layer 104. The first guiding layer 114 is adjacent to the upper surface 104a of the first cladding layer 104. The first guiding layer 114 may be formed, for example, using an n-type InGaN layer.

The active layer 115 is formed on the first guiding layer 114. The active layer 115 is interposed between the first and second guiding layers 114 and 116. The active layer 115 has a multiple quantum well (MQW) structure obtained by laminating three quantum well structures, for example, including a quantum well layer and a barrier layer. The quantum well layer is made of, for example, $In_{0.5}Ga_{0.5}N$, and the barrier layer is made of, for example, $In_{0.15}Ga_{0.85}N$. The thicknesses of the quantum well layer and the barrier layer are set to about, for example, from several nanometers to 10 nm.

The second guiding layer 116 is formed on the active layer 115. The second guiding layer 116 is adjacent to the lower surface 106a of the second cladding layer 106. As the second guiding layer 116, for example, an InGaN layer of a second conductivity type (for example, p-type) may be used. The thicknesses of the first and second guiding layers 114 and 116 are larger than the thicknesses of the quantum well layer and the barrier layer, and are set to, for example, several tens of nanometers to several hundreds of nanometers.

The semiconductor member 118 is formed on the first cladding layer 104. In the example of FIG. 2, the planar shape of the semiconductor member 118 is rectangular as in the planar shape of the fine-wall-shape member 111. However, the invention is not particularly limited thereby, and, for example, a parallelogram shape may be used. A plurality of the semiconductor members 118 has the same planar shape in the example of FIG. 2.

The fine-wall-shape member 111 and the semiconductor member 118 are alternately arranged from the first side surface 110a to the second side surface 110b as shown in FIG. 2. That is, out of a plurality of fine-wall-shape members 111, the semiconductor member 118 is formed between the neighboring first and second fine-wall-shape members 112 and 113. Furthermore, the semiconductor member 118 is also arranged on the opposite side of the first fine-wall-shape member 112 relative to the second fine-wall-shape member 113 (on the side toward the first side surface 110a) and on the opposite side of the second fine-wall-shape member 113 relative to the first fine-wall-shape member 112 (on the side toward the second side surface 110b). For example, the neighboring fine-wall-shape member 111 and the semiconductor member 118 have contact with each other. Also, the semiconductor member 118 is formed to bury gaps between a plurality of fine-wall-shape members 111. Also, a remaining area of the semiconductor body 110 except for the fine-wall-shape member 111 is occupied by the semiconductor member 118.

The semiconductor member 118 may be made of, for example, undoped InGaN. Since the semiconductor member 118 is undoped, and the first and second guiding layers 114 and 116 of the fine-wall-shape member 111 are doped as described above, the injection carriers (electrons and holes) can flow into the fine-wall-shape member 111 avoiding the semiconductor member 118.

Part of the active layer 115, part of the guiding layers 114 and 116, and a part of the semiconductor member 118 may constitute a waveguide 119 as shown in FIGS. 2 and 3. The active layer (quantum well layer) 115 can emit light, and this light can propagate through the waveguide 119. As shown in FIG. 2, the waveguide 119 may be arranged to extend from the first side surface 110a to the second side surface 110b in a direction A as seen in a plan view. The direction A is directed from the center of the first end surface 119a of the waveguide 119 provided on the first side surface 110a to the center of the second end surface 119b of the waveguide 119 provided on the second side surface 110b.

The waveguide 119 is arranged to intersect with the first fine-wall-shape member 112 and the second fine-wall-shape member 113. That is, a virtual straight line R connecting the center of the first end surface 119a and the center of the second end surface 119b intersects with the first and second fine-wall-shape members 112 and 113.

The length of the fine-wall-shape member 111 in an extending direction A of the waveguide 119 (the length along the direction A) is set to $\lambda/2n_1$. That is, the length $D_{112}$ of the first fine-wall-shape member 112 in the direction A is set to $\lambda/2n_1$, and the length $D_{113}$ of the second fine-wall-shape member 113 in the extending direction A is set to $\lambda/2n_1$. In addition, the length $D_{118}$ of the semiconductor member 118 in the direction A is set to $\lambda/2n_2$. Here, $\lambda$ denotes a wavelength of the light generated in the active layer 115, $n_1$ denotes an effective refractive index of the first and second fine-wall-shape members 112 and 113 (the effective refractive index in the cross section perpendicular to the direction normal to the first cladding layer 104 including in the fine-wall-shape members 112 and 113), and $n_2$ denotes an effective refractive index of the semiconductor member 118 (the effective refractive index of the cross section perpendicular to the direction normal to the first cladding layer 104 including in the semiconductor member 118).

A refractive index n can be expressed as the following equation (1):

$$n = \left[\int_{-\infty}^{\infty} n(z) \left| E(z) \right|^2 dz\right] / \left[\int_{-\infty}^{\infty} |E(z)|^2 dz\right] \quad (1)$$

where Z denotes a thicknesswise direction of the active layer 115 (a direction normal to the first cladding layer 104), E(z) denotes an electric field depending on Z, and n (Z) denotes a refractive index depending on Z.

For example, although part of light propagating through the waveguide 119 in the direction A can be reflected at the interface between the fine-wall-shape member 111 and the semiconductor member 118, the light reflected at the interface between the first fine-wall-shape member 112 and the semiconductor member 118 and the light reflected at the second fine-wall-shape member 113 and the semiconductor member 118 cancel each other by providing the lengths $D_{112}$, $D_{113}$, and $D_{118}$ as described above.

More specifically, in a case where the refractive index of the semiconductor member 118 is larger than those of the fine-wall-shape members 112 and 113, when light incidents from the first fine-wall-shape member 112 to the semiconductor member 118, the phase of the light reflected at the interface while propagating through the waveguide 119 in the direction A is inverted by 180° (out of phase by a half wavelength). At this moment, when light incidents from the semiconductor member 118 to the second fine-wall-shape member 113, the phase of the light reflected at the interface does not change. In a case where the lengths of the fine-wall-shape members 112 and 113 in an extending direction of the waveguide are set to $\lambda/2n_1$, and the length of the semiconductor member 118 in an extending direction of the waveguide is set to $\lambda/2n_2$, a distance between the two interfaces becomes $\lambda/n_2$ in a single round trip. Therefore, if only the phase of the light reflected at one of the interfaces is inverted by 180° (out of phase by a half wavelength), the phases of the two reflected light become opposite to each other, so that they cancel each other. Similarly, in a case where a relationship of the refractive index is reversed (that is, when the refractive index of the semiconductor member 118 is smaller than those of the fine-wall-shape members 112 and 113), only the phase of the other reflected light is inverted, so that the two reflected light have opposite phases, and they cancel each other. In addition, in a case where the first and second fine-wall-shape members 112 and 113 have the same refractive index, the reflectance when light incidents from the first fine-wall-shape member 112 to the semiconductor member 118 is the same as the reflectance when light incidents from the semiconductor member 118 to the second fine-wall-shape member 113. Therefore, since the two reflected light perfectly cancel each other, there is no reflection in practice when light propagates in an extending direction A of the waveguide 119. That is, it is possible to suppress feedback of the light.

Therefore, it is possible to avoid multiple reflections at the interface of the first fine-wall-shape member 112 and the semiconductor member 118 and the interface of the second fine-wall-shape member 113 and the semiconductor member 118. As a result, it is possible to suppress laser oscillation at the interface between the fine-wall-shape member 112 and 113 and the semiconductor member 118. An effective refractive index difference capable of suppressing laser oscillation (an absolute value of the difference between $n_1$ and $n_2$) is not particularly limited. For example, it can be set to about 0.04.

When the lengths $D_{112}$ and $D_{113}$ are set to $\lambda/4n_1$, and the length $D_{118}$ is set to $\lambda/4n_2$, the light reflected at the interface between the first fine-wall-shape member 112 and the semiconductor member 118 and the light reflected at the interface between the semiconductor member 118 and the second fine-wall-shape member 113 are strengthened with each other, so that laser oscillation (distributed feedback (DFB) oscillation or Fabry-Perot oscillation in a local area) may occur by such reflected light.

As shown in FIG. 2, the waveguide 119 is inclined (angled) against the normal line P and extends from the first side surface 110a to the second side surface 110b. By providing the inclined waveguide, it is possible to avoid multiple reflections between first and second end surfaces 119a and 119b. As a result, it is possible to suppress laser oscillation between the first and second end surfaces 119a and 119b.

In addition, a plurality of waveguides 119 may be provided although not shown in the drawings. The waveguide 119 may be formed by a difference of the effective refractive index in a planar direction (for example, perpendicular to the thicknesswise direction of the active layer 115) based on the planar shape of the columnar portion 108 as described below. In addition, the waveguide 119 may be formed by determining a current path based on a planar shape of a contact surface 107a between the contact layer 107 and the second electrode 122 as described below.

The anti-reflection layer 130 may be formed to cover at least one of the first and second end surfaces 119a and 119b of the waveguide 119. The anti-reflection layer 130 may be formed to cover the entire area of the first and second side surfaces 110a and 110b of the semiconductor body 110. It is possible to suppress reflection of light generated in the active layer 115 using the anti-reflection layer 130. That is, it is possible to reduce the reflectance of the end surfaces 119a and 119b to 0% or a value close to 0% using the anti-reflection layer 130. As a result, it is possible to effectively output light from the end surfaces 119a and 119b (also referred to as output surfaces 119a and 119b).

While the anti-reflection layer 130 covers both the first and second end surfaces 119a and 119b in the example of FIG. 2, the anti-reflection layer 130 may cover only the first end surface 119a, and the second end surface 119b may be covered by a high reflection layer. As a result, part of the light generated in the active layer 115 is reflected by the second end surface 119b and then output from the first end surface 119a. The anti-reflection layer 130 and the high reflection layer may include, for example, an $Al_2O_3$ layer, a TiN layer, a $TiO_2$ layer, a SiON layer, an SiN layer, a $SiO_2$ layer, a $Ta_2O_3$ layer, a multilayered film thereof, or the like.

The second cladding layer 106 is formed on the semiconductor body 110. As the second cladding layer 106, for example, a p-type GaN layer may be used.

For example, a pin diode is configured using a p-type second cladding layer 106, an impurity-undoped active layer 115, and an n-type first cladding layer 104.

As described above, the cladding layers 104 and 106 may be made of GaN, and the active layer 115, the guiding layers 114 and 116, and the semiconductor member 118 may be made of $In_xGa_{1-x}N$ ($0<x<1$). As a result, the cladding layers 104 and 106 may be made of a layer having a forbidden bandgap that is larger than those of the active layer 115, the guiding layers 114 and 116, and the semiconductor member 118 and a refractive index that is smaller than those of the active layer 115, the guiding layers 114 and 116, and the semiconductor member 118. Furthermore, it is possible to increase the value x (the value of In against Ga) of the quantum well layer included in the active layer 115 to be larger than the value x of the guiding layers 114 and 116. As a result, it is possible to provide the guiding layers 114 and 116 having a forbidden bandgap that is larger than that of the quantum well layer and a refractive index that is smaller than that of the quantum well layer. Moreover, it is preferable that the value x of the semiconductor member 118 is larger than those of the guiding layers 114 and 116 and smaller than that of the quantum well layer 115. As a result, it is possible to suppress the light generated in the active layer 115 from being absorbed in the semiconductor member 118.

In addition, the active layer 115 can generate green light when the quantum well layer is made of $In_xGa_{1-x}N$ ($0.4 \leq x \leq 0.6$). Therefore, the light-emitting device 100 can output green light.

In addition, if a relationship of the refractive index between each layer is maintained, a subcomponent such as Al may be mixed in each layer 104, 106, 114, and 116 containing the aforementioned composition as a main component. That is, the cladding layers 104 and 106 may be made of AlGaN, and the guiding layers 114 and 116 may be made of InAlGaN. In addition, if a relationship of the refractive index between each layer is maintained, the cladding layers 104 and 106 may be made of AlGaN, and the guiding layers 114 and 116 may be made of GaN. In addition, for example, the cladding layers 104 and 106 may have a super-lattice structure containing the AlGaN layer and the GaN layer, and the guiding layers 114 and 116 may be made of GaN or InGaN.

Using the aforementioned composition of each layer, the active layer 115 (quantum well layer) can generate light and has a function of amplifying the light. The active layer 115 also has a function of guiding the light. The guiding layers 114 and 116 also have a function of guiding the light generated in the active layer 115. The cladding layers 104 and 106 have a function of suppressing leakage by blocking the injection carriers (electrons and holes) and the light. The semiconductor member 118 also has a function of guiding light, but is different from the guiding layers 114 and 116 in that the injection carriers flow avoiding the semiconductor member 118.

More specifically, in the light-emitting device 100, when a forward bias voltage of a pin diode is applied between the first and second electrodes 120 and 122, electrons and holes are injected to the active layer 115 by way of the guiding layers 114 and 116 avoiding the semiconductor member 118, and a recombination of electrons and holes occurs in a portion of the active layer 115 corresponding to the waveguide 119. This recombination generates light. Originating from the generated light, stimulus emission occurs in a chain manner so that the intensity of the light inside the active layer 115 of the waveguide 119 is amplified. For example, a part of the light generated in the active layer 115 of the waveguide 119 may alternately pass through the semiconductor member 118 and the fine-wall-shape member 111 included in the waveguide 119 and be output from the end surfaces 119a and 119b as the output light.

While the end surfaces 119a and 119b are provided in the semiconductor member 118 in the example of FIGS. 1 and 2, it may be provided in the fine-wall-shape member 111. That is, the side surfaces 110a and 110b may be formed using the fine-wall-shape member 111.

The contact layer 107 is formed on the second cladding layer 106 as shown in FIGS. 1 and 3. As the contact layer 107, for example, a p-type GaN layer may be used. The contact layer 107 may make ohmic contact with the second electrode 122. As a result, it is possible to reduce a contact resistance of the second electrode 122.

Although not shown in the drawings, an etch-stop layer or a carrier stopping layer may be formed in between the second cladding layer 106 or the guiding layers 114, 116. The etch-stop layer can improve the accuracy of the etching depth when forming the columnar portion 108 which will be described later. The carrier stopping layer can act to reduce the influence caused by a mobility difference between electrons and holes.

Part of the second cladding layer 106 and the contact layer 107 may configure the columnar portion 108. In a portion included in the columnar portion 108, the effective refractive index can increase in comparison with the portions other than the columnar portion 108 as described below. As a result, it is possible to configure a waveguide 119 by confining light in a planar direction. That is, the plane shape of the waveguide 119 can be determined based on a plane shape of the columnar portion 108.

In addition, it is possible to prevent an injection current from diffusing in a planar direction as described below and to determine a current path between the electrodes 120 and 122 using the columnar portion 108 (by blocking the current in a planar direction). Although not shown in the drawings, the side surface of the columnar portion 108 may be inclined.

The planar shape of the contact surface 107a between the contact layer 107 and the second electrode 122 may be the same as the planar shape of the columnar portion 108, that is, the planar shape of the waveguide 119. That is, similar to the waveguide 119, the contact surface 107a may extend from the first side surface 110a to the second side surface 110b in the direction A as shown in FIG. 2, and may intersect with the first and second fine-wall-shape members 112 and 113. That is, the length $D_{112}$ shown in FIG. 2 may be the length of the first fine-wall-shape member 112 in an extending direction A of the contact surface 107a. This is similarly applied to the lengths $D_{113}$ and $D_{118}$.

As shown in FIGS. 1 and 3, the insulation member 109 may be disposed on the second cladding layer 106 and on the lateral side of the columnar portion 108. The insulation member 109 may have contact with the side surface of the columnar portion 108. As shown in FIG. 3, for example, the upper surface of the insulation member 109 may be continuous with the upper surface of the contact layer 107. The insulation member 109 may be made of, for example, SiN, $SiO_2$, polyimide, or the like. If the insulation member 109 is made of such materials, the current between electrodes 120 and 122 may flow to the columnar portion 108 interposed between the insulation members 109 avoiding the insulation member 109. The insulation member 109 may have a refractive index smaller than that of the second cladding layer 106. In this case, an effective refractive index of the vertical cross section of a portion including the insulation member 109 is smaller than that of a portion excluding the insulation member 109, that is, the portion including the columnar portion 108. As a result, it is possible to effectively confine light within the waveguide 119 in a planar direction. In addition, although not shown in the drawings, the insulation member 109 may not be provided. It may be interpreted that the insulation member 109 is air.

The first electrode 120 is formed on the entire bottom surface of the substrate 102. The first electrode 120 may have contact with a layer making ohmic contact with the first electrode 120 (in the illustrated example, the substrate 102). The first electrode 120 is electrically connected to the first cladding layer 104 through the substrate 102. The first electrode 120 is one of the electrodes for driving the light-emitting device 100. For example, the first electrode 120 may be obtained by sequentially stacking a Ti layer, an Al layer, and an Au layer from the side of the substrate 102, or the like.

In addition, a second contact layer (not shown) may be provided between the first cladding layer 104 and the substrate 102, and the second contact layer may be exposed through dry etching or the like to provide a first electrode 120 on the second contact layer. As a result, it is possible to obtain a single-sided electrode structure. This configuration is particularly effective in a case where part of the substrate 102 is insulative as in the GaN template substrate obtained by growing the GaN layer on the sapphire substrate.

The second electrode 122 is formed on the contact layer 107. In addition, the second electrode 122 may be provided on the insulation member 109 as shown in FIG. 3. The second electrode 122 is electrically connected to the second cladding layer 106 through the contact layer 107. The second electrode 122 is the other electrode for driving the light-emitting device 100. The second electrode 122 may be obtained by, for example, sequentially stacking a Ni layer, a Pd layer, an Au layer from the side of the contact layer 107, or the like.

The light-emitting device 100 described above may be applied, for example, to a light source of a projector, a display, an illumination apparatus, a measurement apparatus, or the like.

The light-emitting device 100 according to the embodiment of the invention has, for example, the following characteristics.

In the light-emitting device 100, the semiconductor member 118 is formed between the first and second fine-wall-shape members 112 and 113. Therefore, it is possible to suppress a non-radiative recombination on the side surfaces of the first and second fine-wall-shape members 112 and 113 forming the waveguide 119. Therefore, in the light-emitting device 100, it is possible to obtain high light-emitting efficiency while strain between the substrate 102 and the semiconductor body 110 is relaxed. For example, when the side surface of the fine-wall-shape member is exposed, a non-radiative recombination occurs due to an impurity or a defect in the vicinity of the side surface so that the light-emitting efficiency may be degraded.

Furthermore, in the light-emitting device 100, the semiconductor member 118 is made of InGaN, and the first and second fine-wall-shape members 112 and 113 are made of, for example, InGaN. For this reason, compared to a case where an insulation member made of silicon oxide or polyimide is formed between the fine-wall-shape members 112 and 113, a thermal expansion coefficient of the fine-wall-shape members 112 and 113 and the semiconductor member 118 can be close to each other. Therefore, in the light-emitting device 100, for example, even when heat is generated by current injection, it is possible to reduce stress applied to the semiconductor body 110 due to thermal expansion, and it is possible to suppress degradation of light-emitting efficiency and a reduction of useful life caused by the stress. This is similarly applied to a case where the active layer 115 is made of InGaN, and the guiding layers 114 and 116 are made of GaN.

Furthermore, in the light-emitting device 100, the length $D_{112}$ of the first fine-wall-shape member 112 in the direction A is set to $\lambda/2n_1$, and the length $D_{113}$ of the second fine-wall-shape member 113 in the direction A is set to $\lambda/2n_1$. In addition, the length $D_{118}$ of the semiconductor member 118 in the direction A is set to $\lambda/2n_2$. As a result, out of the light propagating in the direction A, the light reflected at the interface between the first fine-wall-shape member 112 and the semiconductor member 118 and the light reflected at the interface between the semiconductor member 118 and the second fine-wall-shape member 113 cancel each other as described above. Therefore, it is possible to avoid multiple reflections between the interface of the first fine-wall-shape member 112 and the semiconductor member 118 and the interface between the second fine-wall-shape member 113 and the semiconductor member 118. As a result, it is possible to suppress laser oscillation at the interface between the fine-wall-shape members 112 and 113 and the semiconductor member 118.

In the light-emitting device 100, the semiconductor member 118 may also be formed on the opposite side of the first fine-wall-shape member 112 relative to the second fine-wall-shape member 113 (on the side toward the first side surface 110*a*) and on the opposite side of the second fine-wall-shape member 113 relative to the first fine-wall-shape member 112 (on the side toward the second side surface 110*b*). For this reason, it is possible to more effectively suppress a non-radiative recombination on the side surface of the fine-wall-shape members 112 and 113.

In the light-emitting device 100, the anti-reflection layer 130 may be formed to cover the first and second end surfaces 119*a* and 119*b* of the waveguide 119. As a result, it is possible to reduce the reflectance on the end surfaces 119*a* and 119*b* serving as an output surface. Therefore, it is possible to avoid multiple reflections of the light between the end surfaces 119*a* and 119*b*. As a result, it is possible to suppress laser oscillation between the end surfaces 119*a* and 119*b* caused by using the entire waveguide as a resonator. Furthermore, in the light-emitting device 100, it is also possible to suppress laser oscillation caused by local reflection or feedback at the interface inside the device. For this reason, the light-emitting device 100 may be a super luminescent diode. Therefore, the light-emitting device 100 can suppress laser oscillation and reduce speckle noise when it is used as a light source in an image projection apparatus such as a projector or an image display apparatus.

In the light-emitting device 100, the quantum well layer of the active layer 115 may be made of $In_xGa_{1-x}N$ ($0.4 \leq x \leq 0.6$). As a result, the light-emitting device 100 can output green light.

In the light-emitting device 100, the semiconductor member 118 may be undoped, and the first and second guiding layers 114 and 116 of the fine-wall-shape member 111 may be doped. As a result, the injection carrier can flow into the fine-wall-shape member 111 avoiding the semiconductor member 118.

2. Method of Manufacturing Light-emitting Device

Next, a method of manufacturing a light-emitting device according to an embodiment of the invention will be described with reference to the accompanying drawings. FIGS. 4 to 8 are perspective views schematically illustrating a manufacturing process of the light-emitting device 100 according to the embodiment of the invention.

Figure 4:
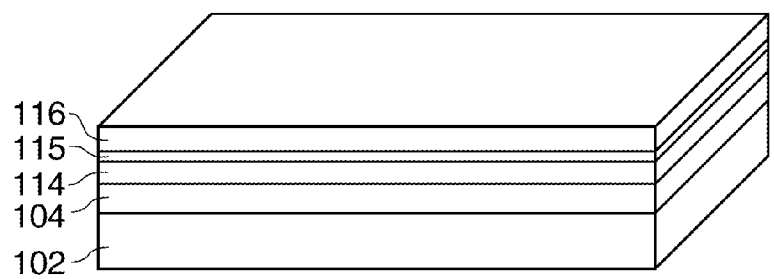
FIG. 4 is a perspective view schematically illustrating a process of manufacturing a light-emitting device.

As shown in FIG. 4, the first cladding layer 104, the first guiding layer 114, the active layer 115, and the second guiding layer 116 are epitaxially grown on the substrate 102 in this order. The epitaxial growth may include, for example, a metal organic chemical vapor deposition (MOCVD) method and a molecular beam epitaxy (MBE) method.

Figure 5:
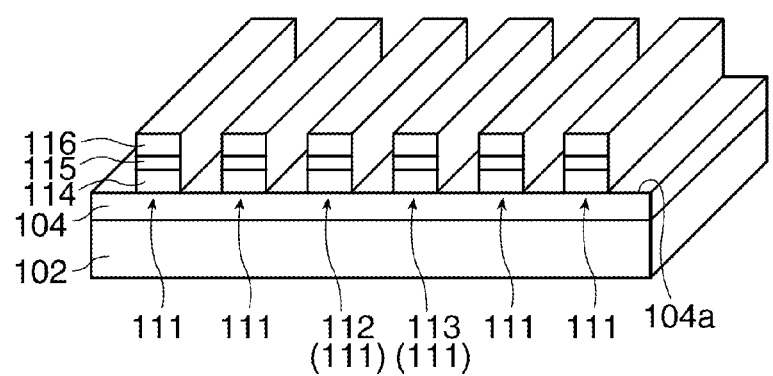
FIG. 5 is a perspective view schematically illustrating a process of manufacturing a light-emitting device.

As shown in FIG. 5, the fine-wall-shape member 111 is formed by patterning the second guiding layer 116, the active layer 115, and the first guiding layer 114. The patterning may be performed, for example, using a photolithography technique and an etching technique. In the illustrated example, the patterning is performed to expose part of the upper surface 104*a* of the first cladding layer 104.

Figure 6:
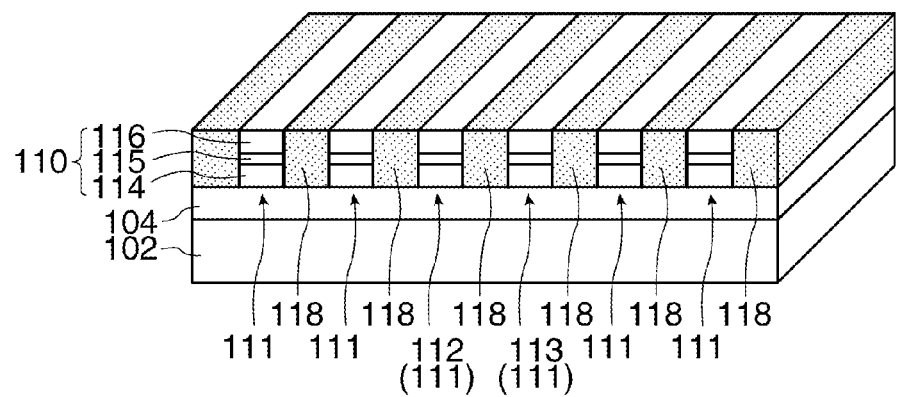
FIG. 6 is a perspective view schematically illustrating a process of manufacturing a light-emitting device.

As shown in FIG. 6, the semiconductor member 118 is formed on the lateral side of the fine-wall-shape member 111 and on the upper surface 104*a* of the exposed first cladding layer 104. As a result, it is possible to form the semiconductor body 110. The semiconductor member 118 may be formed such that the upper surface of the semiconductor member 118 is continuously connected to the upper surface of the fine-wall-shape member 111. The semiconductor member 118 is formed through an epitaxial lateral overgrowth (ELO), for example, using an MOCVD method. In the growth of InGaN included in the semiconductor member 118, the growth rate of the transverse direction (for example, a direction orthogonal to the thicknesswise direction of the active layer 115) is significantly faster than that of the stacking direction (for example, a thicknesswise direction of the active layer 115), which allows a gap between the fine-wall-shape members 111 to be filled relatively readily. Specifically, even when the interval between the neighboring fine-wall-shape members 111 ranges from several tens of nanometers to several hundreds of nanometers, it is possible to more readily fill the gap with the semiconductor member 118 without vacancy by forming the semiconductor member 118 using an ELO in comparison with a chemical vapor deposition (CVD) method or a sputtering method. Furthermore, it is possible to improve crystal quality of the semiconductor member 118 by forming the semiconductor member 118 using an ELO.

Figure 7:
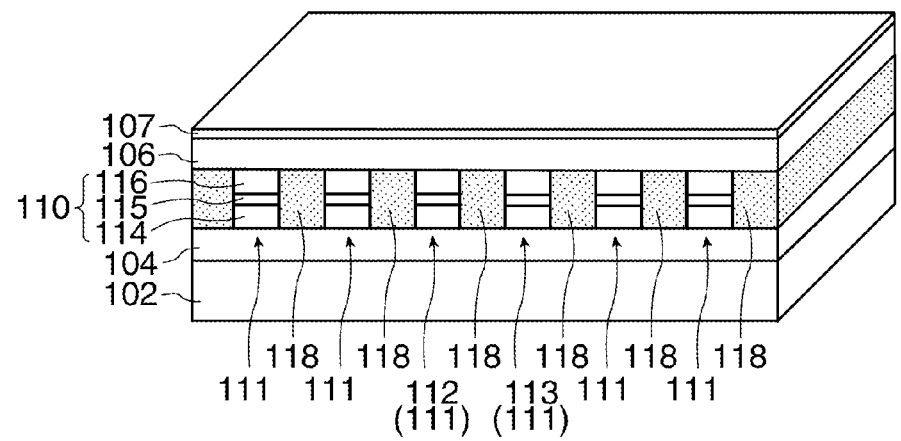
FIG. 7 is a perspective view schematically illustrating a process of manufacturing a light-emitting device.

As shown in FIG. 7, the second cladding layer 106 and the contact layer 107 are epitaxially grown on the semiconductor body 110 in this order. The epitaxial growth method may include, for example, a MOCVD method and an MBE method.

Figure 8:
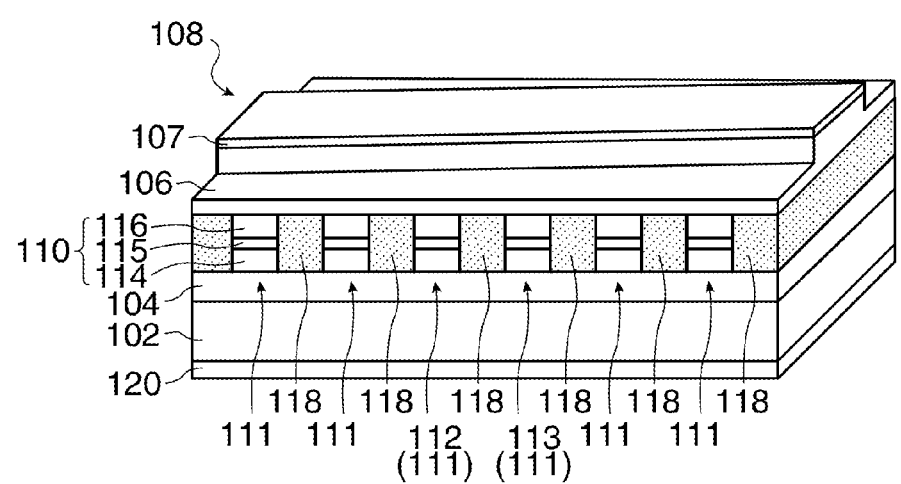
FIG. 8 is a perspective view schematically illustrating a process of manufacturing a light-emitting device.

As shown in FIG. 8, at least the contact layer 107 and part of the second cladding layer 106 are patterned to form the columnar portion 108. The patterning is carried out, for example, using a photolithographic technique and an etching technique. In the illustrated example, the patterning is carried out not to expose the upper surface of the semiconductor body 110.

As shown in FIG. 1, the insulation member 109 is formed to cover the side surface of the columnar portion 108. Specifically, first, for example, the insulation layer (not shown) is formed on the upper side (including the contact layer 107) of the second cladding layer 106, for example, using a CVD method, a doping method, and the like. Next, the upper surface of the contact layer 107 is exposed using, for example, an etching technique or the like. Through the aforementioned process, it is possible to form the insulation member 109.

The second electrode 122 is formed on the contact layer 107 and the insulation member 109 as shown in FIG. 3. The second electrode 122 is formed, for example, through a vacuum deposition method.

Next, the first electrode 120 is formed under the lower surface of the substrate 102. The first electrode 120 is formed, for example, using a vacuum deposition method. The sequence of forming the first electrode 120 and the second electrode 122 is not particularly limited.

As shown in FIG. 2, the anti-reflection layer 130 is formed on the first and second side surfaces 110a and 110b of the semiconductor body 110. The anti-reflection layer 130 is formed, for example, using a CVD method, a sputtering method, an ion assisted deposition method, or the like.

Through the aforementioned process, it is possible to manufacture the light-emitting device 100.

By the aforementioned manufacturing method, it is possible to manufacture the light-emitting device 100 having high light-emitting efficiency.

3. Modified Example of Light-emitting Device

Figure 9:
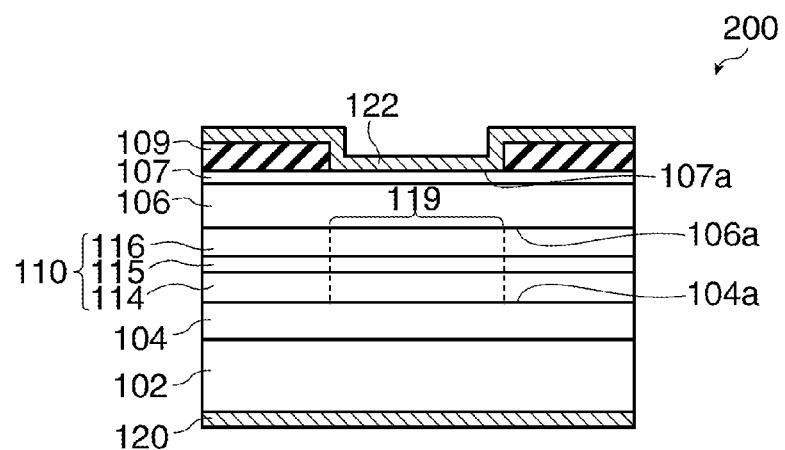
FIG. 9 is a cross-sectional view schematically illustrating a modified light-emitting device.

Next, a light-emitting device according to a modified example of the present embodiment will be described with reference to the accompanying drawings. FIG. 9 is a cross-sectional view schematically illustrating a light-emitting device 200 according to a modified example of the invention, and corresponds to FIG. 3. Hereinafter, a light-emitting device 200 according to a modified example of the invention will be described with reference to the accompanying drawings, in which like reference numerals denote like elements as in the light-emitting device 100 according to the embodiment of the invention, and description thereof will not be repeated.

In the example of the light-emitting device 100, as shown in FIG. 3, an index-guiding type has been described in which a refractive index difference is provided between the area of the insulation member 109 and the area where the insulation member 109 is not provided, that is, the area of the columnar portion 108. In contrast, the light-emitting device 200 may be a gain-guiding type in which the columnar portion 108 is not formed, and a refractive index difference is not provided in the planar direction.

That is, in the light-emitting device 200; as shown in FIG. 9, the contact layer 107 and the second, cladding layer 106 does not form the columnar portion, so that it is unnecessary to form the insulation member 109 in the lateral side of the columnar portion. In the light-emitting device 200, the insulation member 109 is formed on the contact layer 107 other than the upper side of the portion corresponding to the waveguide 119. That is, the insulation member 109 has an opening section over the portion corresponding to the waveguide 119, and the upper surface of the contact layer 107 is exposed at the opening section. The second electrode 122 is formed on the exposed contact layer 107 and the insulation member 109.

In the illustrated example, the planar shape of the contact surface 107a between the second electrode 122 and the contact layer 107 determines the current path between the electrodes 120 and 122, and as a result, the planar shape of the waveguide 119 is determined. Therefore, the contact surface 107a has the same planar shape as that of the waveguide 119. In addition, although not shown in the drawings, it is possible that the second electrode 122 is formed only on the contact layer 107 over the waveguide 119, and is not formed on the insulation member 109.

Similar to the light-emitting device 100, the light-emitting device 200 can be used to obtain high light-emitting efficiency.

4. Projector

Figure 10:
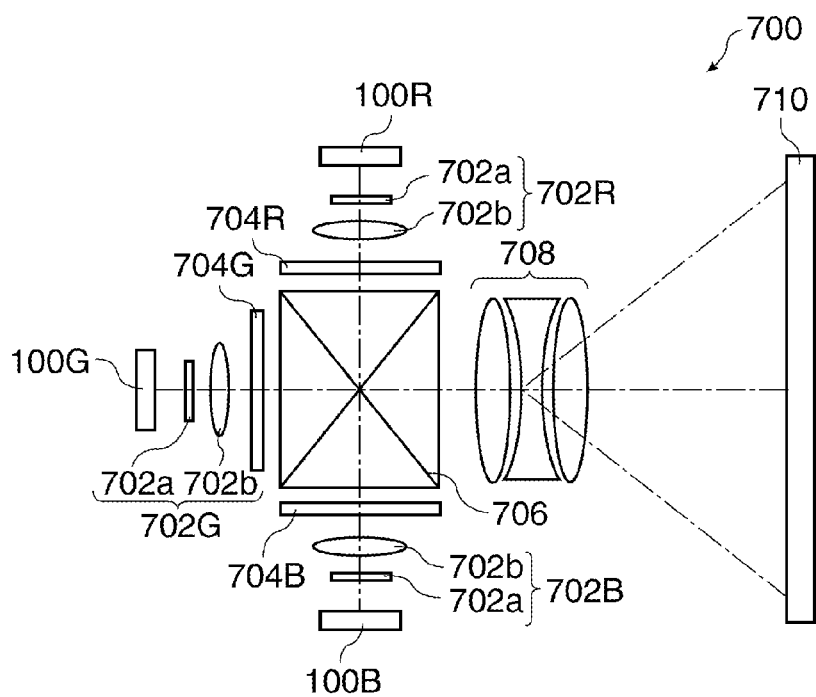
FIG. 10 is a diagram schematically illustrating a projector.

Next, a projector according to an embodiment of the invention will be described. FIG. 10 is a diagram schematically illustrating a projector 700 according to an embodiment of the invention. In addition, in FIG. 10, a case of the projector 700 is omitted for purpose of the convenience. The projector 700 has the light-emitting device according to the embodiment of the invention. Hereinafter, an example in which the light-emitting device 100 is used as the light-emitting device according to the embodiment of the invention will be described.

As shown in FIG. 10, the projector 700 may include a red light source (light-emitting device) 100R, a green light source (light-emitting device) 100G, and a blue light source (light-emitting device) 100B outputting red light, green light, and blue light, respectively. In these, at least the green light source 100G corresponds to the aforementioned light-emitting device 100.

The projector 700 includes transmissive liquid crystal light valves (optical modulators) 704R, 704G, and 704B for modulating respective light output from the light sources 100R, 100G, and 100B based on image information, and a projection lens (projection device) 708 for projecting images formed by the liquid crystal light valves 704R, 704G, and 704B onto a screen (display surface) 710 by magnification. Furthermore, the projector 700 may include a cross dichroic prism (color light synthesizing unit) 706 for synthesizing the colored light output from the liquid crystal light valves 704R, 704G, and 704B and guiding the light into the projection lens 708.

In addition, the projector 700 includes homogenizing optical systems 702R, 702G, and 702B in the downstream of the optical path from the light sources 100R, 100G, and 100B, respectively, in order to homogenize an illumination distribution of the light output from the light sources 100R, 100G, and 100B. As a result, the liquid crystal light valves 704R, 704G, and 704B are illuminated with the light of which the illumination distribution is homogenized. Each of the homogenizing optical systems 702R, 702G, and 702B is configured by, for example, a hologram 702a and a field lens 702b.

The three colored light beams modulated by the liquid crystal light valves 704R, 704G, and 704B incident on the cross dichroic prism 706. This prism is formed by bonding four rectangular prisms, and a dielectric multi-layer film for reflecting red light and a dielectric multi-layer film for reflecting blue light are arranged in a cross shape on the surface thereof. The three colored light beams are synthesized by such dielectric multi-layer films so as to form light representing a color image. Then, the synthesized light is projected onto the screen 710 by the projection lens 706, and thus a magnified image is displayed.

The projector 700 can have a green light source 100G having high light-emitting efficiency. Accordingly, the projector 700 can also provide high power conversion efficiency as a whole.

Although a transmissive liquid crystal light valve is used as the optical modulator in the aforementioned example, light valves other than the liquid crystal light valve or a reflective light valve may be used. Such a light valve may include, for example, a reflective liquid crystal light valve Or a digital micro mirror device. In addition, the configuration of the projection optical system can be appropriately modified according to the type of the light valve used.

In addition, the light sources 100R, 100G, and 100B can be used as the light source of a scanning type image display apparatus (projector) which has a scanning unit as an image forming device for displaying an image with a desired size on a display surface by scanning light from the light source onto the screen.

The aforementioned embodiments and the modified examples are just exemplary and not intended to limit the invention. For example, each embodiment and each modified example may be combined in an appropriate form.

Although embodiments of the invention have been described in detail above, it would be readily appreciated by those skilled in the art that they may be variously modified without substantially departing from novel concepts and effects. Therefore, it is intended that such modified examples are included in the scope of the invention.

What is claimed is:

1. A light-emitting device comprising:
a first layer having a first surface;
a second layer having a second surface that faces the first surface; and
a semiconductor body interposed between the first surface and the second surface,
wherein the semiconductor body has a first fine-wall-shape member, a second fine-wall-shape member, and a semiconductor member,
the first fine-wall-shape member and the second fine-wall-shape member having:
  a third layer adjacent to the first surface;
  a fourth layer adjacent to the second surface; and
  a fifth layer interposed between the third layer and the fourth layer,
the semiconductor member is interposed between the first fine-wall-shape member and the second fine-wall-shape member,
the first layer and the second layer are made of GaN,
the third layer, the fourth layer, the fifth layer, and the semiconductor member are made of $In_xGa_{1-x}N$ $(0<x<1)$,
a value x of the fifth layer is larger than values x of the third layer, the fourth layer, and the semiconductor member,
the fifth layer generates and guides light,
the third layer and the fourth layer guide the light generated in the fifth layer,
the first layer and the second layer suppress leakage of the light generated in the fifth layer,
a waveguide through which the light generated in the fifth layer propagates intersects with the first fine-wall-shape member and the second fine-wall-shape member as seen in a plan view from a direction normal to the first surface,
lengths of the first fine-wall-shape member and the second fine-wall-shape member in an extending direction of the waveguide are set to $\lambda/2n_1$, and
a length of the semiconductor member in an extending direction of the waveguide is set to $\lambda/2n_2$,
where $\lambda$ is a wavelength of the light generated in the fifth layer,
$n_1$ is an effective refractive index of the first fine-wall-shape member and the second fine-wall-shape member, and
$n_2$ is an effective refractive index of the semiconductor member.

2. A light-emitting device comprising:
a first layer having a first surface;
a second layer having a second surface that faces the first surface; and
a semiconductor body interposed between the first and second surfaces,
wherein the semiconductor body has a first fine-wall-shape member, a second fine-wall-shape member, and a semiconductor member,
the first and second fine-wall-shape members having:
  a third layer adjacent to the first surface,
  a fourth layer adjacent to the second surface, and
  a fifth layer interposed between the third and fourth layers,
the semiconductor member is interposed between the first and second fine-wall-shape members,
the first and second layers are made of AlGaN,
the third and fourth layers are made of GaN,
the fifth layer and the semiconductor member are made of $In_xGa_{1-x}N$ $(0<x<1)$,
a value x of the fifth layer is larger than a value x of the semiconductor member,
the fifth layer generates and guides light,
the third and fourth layers guide the light generated in the fifth layer,
the first and second layers suppress leakage of the light generated in the fifth layer,
a waveguide through which the light generated in the fifth layer propagates intersects with the first and second fine-wall-shape members as seen in a plan view from a direction normal to the first surface,
lengths of the first and second fine-wall-shape members in an extending direction of the waveguide are set to $\lambda/2n_1$, and
a length of the semiconductor member in an extending direction of the waveguide is set to $\lambda/2n_2$,
where $\lambda$ is a wavelength of the light generated in the fifth layer,
$n_1$ is an effective refractive index of the first and second fine-wall-shape members, and
$n_2$ is an effective refractive index of the semiconductor member.

3. The light-emitting device according to claim 1, wherein the semiconductor member is on an opposite side of the first fine-wall-shape member relative to the second fine-wall-shape member and on the opposite side of the second fine-wall-shape member relative to the first fine-wall-shape member.

4. The light-emitting device according to claim 1, further comprising:
a sixth layer covering an output surface of the semiconductor body,
wherein the sixth layer suppresses reflection of the light generated in the fifth layer.

5. The light-emitting device according to claim 1, wherein a value x of the fifth layer is equal to or larger than 0.4 and equal to or smaller than 0.6.

6. The light-emitting device according to claim 1, wherein the third layer is doped with a first conductivity type, the fourth layer is doped with a second conductivity type, and the semiconductor member is undoped.

7. The light-emitting device according to claim 1, further comprising:
a first electrode electrically connected to the first layer;
a second electrode electrically connected to the second layer, and
a seventh layer between the second layer and the second electrode,
wherein the seventh layer makes ohmic contact with the second electrode,
the semiconductor body has a third surface connected to the first and second surfaces and a fourth surface that is connected to the first and second surfaces and faces the third surface,
a contact surface between the seventh layer and the second electrode extends from the third surface to the fourth surface,
the contact surface intersects with the first and second fine-wall-shape members as seen in a plan view from a direction normal to the first surface,
lengths of the first and second fine-wall-shape members in an extending direction of the contact surface are set to $\lambda/2n_1$, and
a length of the semiconductor member in an extending direction of the contact surface is set to $\lambda/2n_2$.

8. A light-emitting device comprising:
a first layer;
a plurality of wall-shape members that has a rectangular shape elongated in an in-plane direction of the first layer and is arranged in a direction perpendicular to the longer direction of the rectangular shape on the first layer;
a semiconductor member that is made of $In_xGa_{1-x}N$ ($0<x<1$) and provided between the plurality of wall-shape members; and
a second layer disposed on the plurality of wall-shape members and the semiconductor member,
wherein the wall-shape member includes a first guiding layer, a light-emitting layer, and a second guiding layer sequentially stacked in a direction normal to an in-plane direction of the first layer,
the light-emitting layer is made of $In_yGa_{1-y}N$ ($0<x<y<1$) and generates light having a wavelength $\lambda$,
the first and second guiding layers guide the light generated in the light-emitting layer in a first direction along an in-plane direction of the first layer,
the first and second layers suppress leakage of the light generated in the light-emitting layer,
the first direction intersects with the longer direction of the plurality of wall-shape members,
a length of the wall-shape member in the first direction is set to $\lambda/2n_1$, where $n_1$ is an effective refractive index of the wall-shape member, and
a length of the semiconductor member in the first direction is set to $\lambda/2n_2$, where $n_2$ is an effective refractive index of the semiconductor member.

9. A projector comprising:
the light-emitting device according to claim 1;
an optical modulator that modulates the light output from the light-emitting device based on image information; and
a projection device that projects an image formed by the optical modulator.

* * * * *